United States Patent [19]
Chapek et al.

[11] Patent Number: 6,096,660
[45] Date of Patent: Aug. 1, 2000

[54] METHOD FOR REMOVING UNDESIRABLE SECOND OXIDE WHILE MINIMALLY AFFECTING A DESIRABLE FIRST OXIDE

[75] Inventors: David L. Chapek; John T. Moore, both of Boise, Id.

[73] Assignee: Micron Technology, Inc., Boise, Id.

[21] Appl. No.: 08/915,874

[22] Filed: Aug. 21, 1997

[51] Int. Cl.[7] ............................. H01L 21/31; H01L 21/76
[52] U.S. Cl. .................... 438/775; 438/425; 438/225; 438/297
[58] Field of Search ................................. 438/775, 425, 438/225, 297, 362, 439

[56] References Cited

U.S. PATENT DOCUMENTS

| | | | |
|---|---|---|---|
| 5,177,028 | 1/1993 | Manning | 437/41 |
| 5,236,856 | 8/1993 | Chan et al. | 437/47 |
| 5,273,924 | 12/1993 | Chan et al. | 437/46 |
| 5,313,087 | 5/1994 | Chan et al. | 257/538 |
| 5,384,289 | 1/1995 | Westmoreland | 437/245 |
| 5,466,639 | 11/1995 | Ireland | 437/195 |
| 5,573,974 | 11/1996 | Hwang | 438/452 |
| 5,741,396 | 4/1998 | Loenstein | 438/724 |
| 5,821,153 | 10/1996 | Tsai et al. | 438/775 |

OTHER PUBLICATIONS

Stanley Wolf Silicon Processing for the VSLI ERA vol. 3 Lattice Press pp. 345,648,650, 1995.

*Primary Examiner*—Charles Bowers
*Assistant Examiner*—David S Blum
*Attorney, Agent, or Firm*—Schwegman, Lundberg, Woessner & Kluth, P.A.

[57] ABSTRACT

The present invention relates generally to removing an undesirable second oxide, while minimally affecting a desirable first oxide, on an integrated circuit. The integrated circuit may be part of a larger system.

The second oxide is first converted to another material, such as oxynitride. The other material has differing characteristics, such as etching properties, so that it can then be removed, without substantially diminishing the first oxide.

The conversion may be accomplished by heating. Heating may be accomplished by rapid thermal or furnace processing. Subsequently, the other material is removed from the integrated circuit, for example by hot phosphoric etching, so that the desirable first oxide is not substantially affected.

16 Claims, 3 Drawing Sheets

METHOD FOR REMOVING UNDESIRABLE SECOND OXIDE WHILE MINIMALLY AFFECTING A DESIRABLE FIRST OXIDE

FIELD OF THE INVENTION

The present invention relates generally to a method for removing an undesirable oxide while minimally affecting a desirable oxide, and more specifically to a method using heating to remove oxidized films from an integrated circuit while minimally affecting field oxide.

BACKGROUND OF THE INVENTION

Electronics technology has proliferated with the arrival of inexpensive and high performance integrated circuits, including communications transceivers, microprocessors, and memory. As a result, complex electronics systems, such as personal computers and cellular telephones, have become widely held consumer goods.

Integrated circuits are often fabricated with multiple devices, such as transistors. To minimize integrated circuit size, and hence integrated circuit cost, these devices are often positioned in close proximity to one another. As a result, undesirable inter-device effects can arise. For example, undesired current can leak between devices. Alternatively, a device, such as a transistor, can switch on as a result of positive feedback between proximate devices. This effect is known as latch-up. Leakage current and latch-up are understood by one skilled in the art.

To diminish these unwanted inter-device effects, it is desirable to adequately isolate proximate devices. Conventionally, inter-device isolation is accomplished by creating a field oxide between the devices. The field oxide is an electrical insulator. Thus, proximate devices are substantially electrically isolated if the field oxide has adequate dimensions, including height, length and width. However, the use of a field oxide with inadequate dimensions may result in leakage current and latch-up.

Another undesirable effect is the unintentional fabrication of a parasitic metal oxide semiconductor field effect transistor (MOSFET) 10 on an integrated circuit due to close proximity of inadequately isolated adjacent devices. For example, FIG. 1 illustrates a parasitic MOSFET formed by a conductor 12, active areas 14, and a first oxide 16. The integrated circuit may be a flash memory, including flash cells and MOSFETs, or other semiconductor devices. The first oxide 16 may be field oxide. The active areas may be the sources or drains of flash cells or MOSFETs. The conductor 12 may be a wordline of the flash memory. The design and operation of flash memory are known by one skilled in the art.

The parasitic MOSFET 10 operation is now described. The conductor 12 and the first oxide 16 function as a gate. The active areas 14 operate as sources and drains. Although not constructed as a conventional transistor, the parasitic MOSFET 10 nevertheless may function like one if the first oxide 16 has insufficiently large dimensions. As a result, undesirable leakage current and latch-up may occur. Therefore, it is necessary to maintain adequate first oxide 16 dimensions.

Although adequate first oxide dimensions may be initially fabricated, subsequent semiconductor processing steps tend to greatly diminish the dimensions of the first oxide 16 resulting in poor isolation between devices. Therefore, there is a need in the art for a way of fabricating integrated circuit devices which preserves the field oxide grown for isolation during subsequent processing steps.

SUMMARY OF THE INVENTION

These and other shortcomings of the prior art are overcome by the present invention. In accordance with the present invention, there is provided a method of removing undesirable second oxide, while minimally affecting a desirable first oxide, on an integrated circuit. The integrated circuit may be part of a larger system.

The second oxide is first converted to another material, such as oxynitride. The other material has some differing characteristics, such as etching properties, so that it can then be removed, without substantially diminishing the first oxide. The conversion may be accomplished by heating, for example using rapid thermal or furnace processing. Subsequently, the other material is removed from the integrated circuit by a technique, such a hot phosphoric etching, which does not substantially affect the desirable oxide.

Further features and advantages of the present invention, as well as the structure and operation of various embodiments of the present invention, are described in detail below with reference to the accompanying drawings.

BRIEF DESCRIPTION OF THE DRAWINGS

The present invention is described with reference to the accompanying drawings. In the drawings, like reference numbers indicate identical or functionally similar elements. Additionally, the left-most digit(s) of a reference number identifies the drawing in which the reference number first appears.

DETAILED DESCRIPTION OF THE EMBODIMENTS

In the following detailed description of the preferred embodiments, reference is made to the accompanying drawings which form a part hereof, and in which is shown by way of illustration specific preferred embodiments in which the inventions may be practiced. These embodiments are described in sufficient detail to enable those skilled in the art to practice the invention, and it is to be understood that other embodiments may be utilized and that logical, mechanical and electrical changes may be made without departing from the spirit and scope of the present inventions. The following detailed description is, therefore, not to be taken in a limiting sense, and the scope of the present inventions is defined only by the appended claims.

The present invention is directed toward facilitating removal of an undesirable oxide, while minimally affecting a desirable oxide, on an integrated circuit. This goal is achieved by converting the undesirable oxide into another substance, such as oxynitride. The conversion may be accomplished with heating, for example using rapid thermal or furnace processing.

Figure 1:
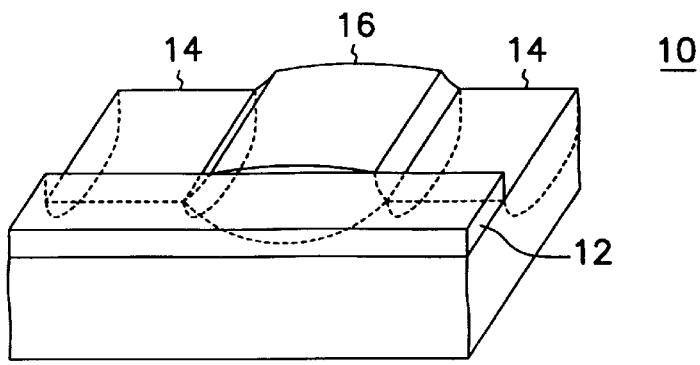
FIG. 1 is a cross-sectional view of a parasitic metal oxide semiconductor field effect transistor.
Figure 2:
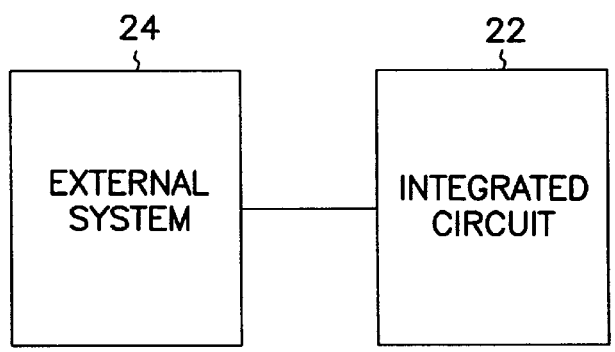
FIG. 2 is a block diagram of an integrated circuit coupled to an external system.

The integrated circuit 22 may be coupled to an external system 24 as illustrated in FIG. 2. The integrated circuit 22 and the external system 24 may be respectively memory and a microprocessor. Alternatively, the external system 24 may be a microcomputer, a cellular telephone, or another form of electronic equipment. Also, the integrated circuit 22 may be a microprocessor or a communications transceiver.

The present invention is used to fabricate an integrated circuit 22 with a variety of materials and processes. The materials and processes are known to one skilled in the art.

Figure 3:
FIG. 3 is a cross-sectional view of an integrated circuit after formation of a base layer.

The integrated circuit 22 fabrication is commenced with formation of a base layer 32, such as a substrate, (step 30), shown in FIG. 3. The base layer 32 typically comprises a semiconductor material such as silicon or gallium arsenide. However, the base layer 32 may be a different type of material, such as an insulator.

Figure 4:
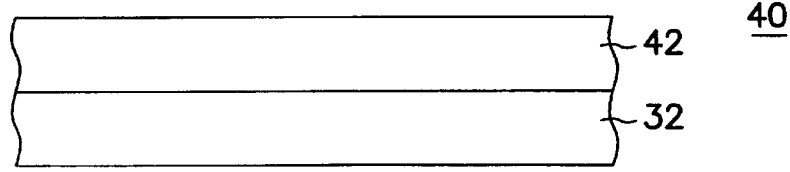
FIG. 4 is a cross-sectional view of an integrated circuit after forming a pad oxide.
Figure 5:
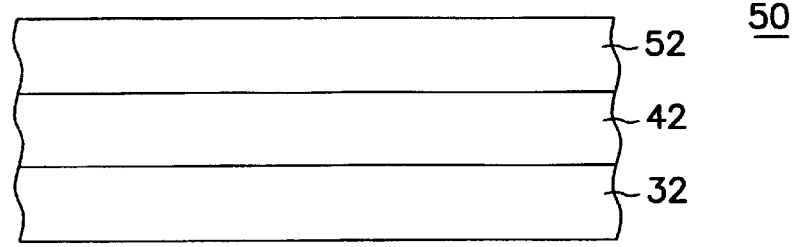
FIG. 5 is a cross-sectional view of an integrated circuit after forming nitride.

Next, a pad oxide 42 is formed on the base layer 32 (step 40), as shown in FIG. 4. Then, nitride 52 is formed on the pad oxide 42 (step 50), as shown in FIG. 5. The nitride 52 may be silicon nitride.

Figure 6:
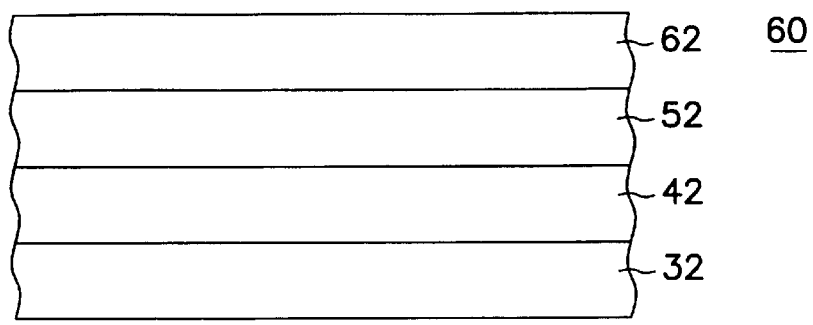
FIG. 6 is a cross-sectional view of an integrated circuit after forming resist.
Figure 7:
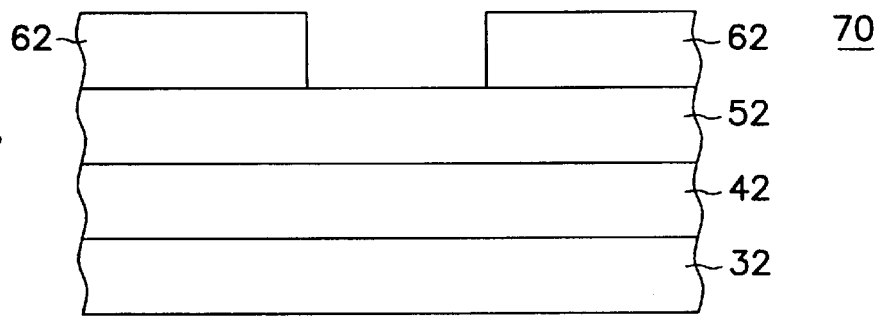
FIG. 7 is a cross-sectional view of an integrated circuit after patterning the resist.
Figure 8:
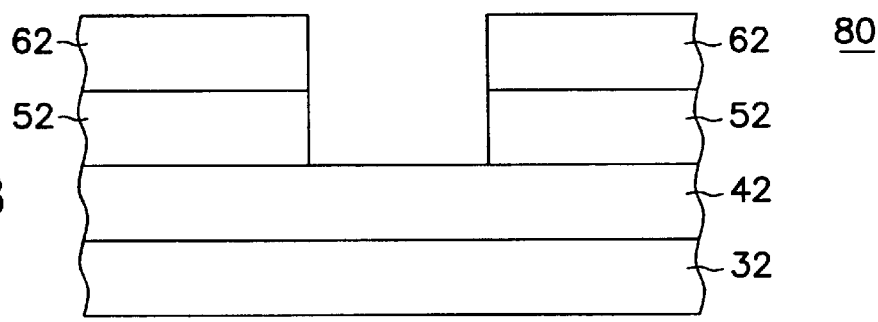
FIG. 8 is a cross-sectional view of an integrated circuit after removing nitride not covered by the resist.
Figure 9:
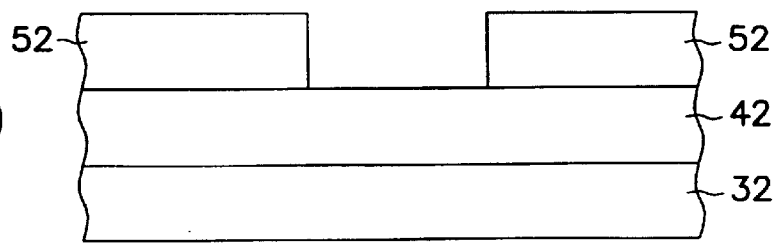
FIG. 9 is a cross-sectional view of an integrated circuit after removing the resist.
Figure 10:
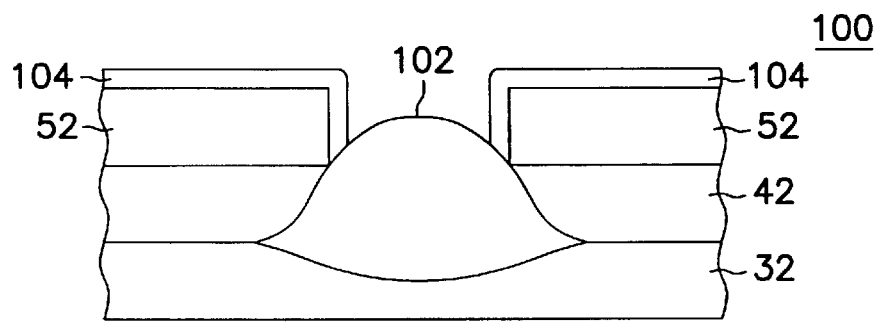
FIG. 10 is a cross-sectional view of an integrated circuit after forming oxide.

Subsequently, the nitride 52 is patterned with the following steps. First, a resist 62 is formed on the nitride 52 (step 60), as shown in FIG. 6. Then, the resist 62 is patterned (step 70), as shown in FIG. 7. Next, nitride 52 not covered by resist 62 is removed (step 80), illustrated in FIG. 8. Nitride 52 removal may be accomplished by wet or dry etching. Subsequently, the resist 62 is removed from the integrated circuit 22 (step 90), as shown in FIG. 9. A first oxide 102 is then formed in the region where the nitride 52 has been removed (step 100), as illustrated in FIG. 10. The first oxide 102 may be field oxide.

The remaining nitride 52 is susceptible to surface oxidation. Typically, a second oxide 104 is also formed on the nitride 52. The first oxide 102 and second oxide 104 may be silicon dioxide.

Typically, the nitride 52 must be removed to permit complete fabrication of the integrated circuit 22. However, first, the second oxide 104 on the nitride 52 must be removed. Because the first oxide 102 and the second oxide 104 coexist on the integrated circuit 22 surface, removal of the second oxide 104 results in depletion of the first oxide 102. As a result, inter-device isolation deteriorates and leakage current and latch-up may occur. Therefore, it is desirable to convert the undesirable second oxide 104 to another material. The other material should have differing characteristics, such as etching properties, from the first oxide 102 so that it can be removed, without substantially diminishing the desirable first oxide 102.

Typically, the heating of the integrated circuit is performed between temperatures of 900 and 1200 degrees Celsius, between pressures of 200 millitorr and one atmosphere, and between times of 10 seconds and 10 minutes. Preferably, the heating of the integrated circuit is performed between temperatures of 1050 and 1100 degrees Celsius, at a pressure of one atmosphere, and between times of one and two minutes.

In the preferred embodiment of the present invention, the second oxide 104 is converted to oxynitride by heating the integrated circuit 22 in an environment including a chemical element other than oxygen, such as nitrogen. For example, the environment may comprise ammonia. Thus, the heating of the integrated circuit 22 must be typically performed in a closed environment.

Figure 11:
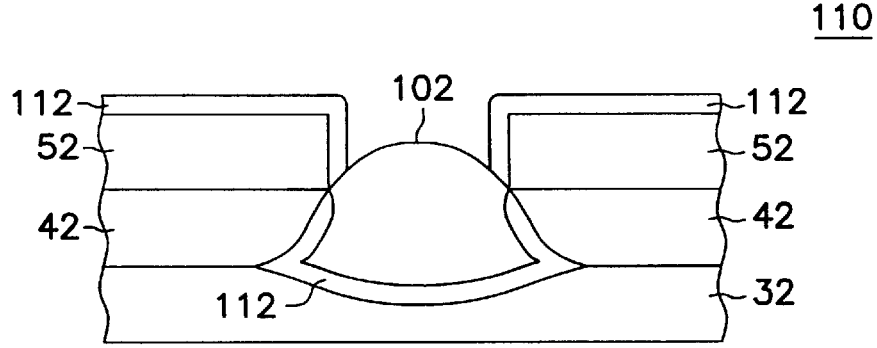
FIG. 11 is a cross-sectional view of an integrated circuit after heating.

The oxynitride 112 covers the nitride 52, as shown in FIG. 11 (step 110). Oxynitride 112 may also form between the first oxide 102 and the base layer 32. The oxynitride 112 between the first oxide 102 and the substrate 32 may generally be retained because it typically has the same insulating properties as the first oxide 102.

Figure 12:
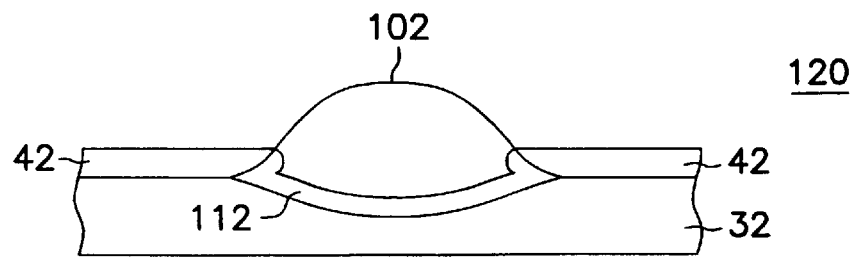
FIG. 12 is a cross-sectional view of an integrated circuit after removing oxynitride.

Next, the oxynitride 112, above the nitride 52, and the nitride 52 are removed by a means that insubstantially diminishes the first oxide 102 (step 120), as shown in FIG. 12. Typically, the removal step is achieved by etching the integrated circuit 12. The etch may be hot phosphoric acid. Typically the etch with hot phosphoric acid is performed between room temperature and the boiling point of the hot phosphoric acid. The etch with hot phosphoric acid is preferably performed between 140 and 160 degrees Celsius. The hot phosphoric acid removes the oxynitride 112 and nitride 54 at a much faster rate than the first oxide 102 so that the first oxide 102 is insubstantially diminished.

Fabrication of the integrated circuit 22 is completed with conventional processing steps. These conventional processing steps are known by one skilled in the art.

CONCLUSION

Although specific embodiments have been illustrated and described herein, it will be appreciated by those of ordinary skill in the art that any arrangement which is calculated to achieve the same purpose may be substituted for the specific embodiments shown. This patent is intended to cover any adaptations or variations of the present invention. Therefore, it is manifestly intended that this invention be limited only by the claims and the equivalents thereof.

We claim:

1. A method of fabricating a semiconductor wafer, comprising:
   providing a semiconductor wafer having a first oxide layer and a second oxide layer formed thereon;
   converting the second oxide layer to another material; and
   simultaneously exposing the another material and the first oxide layer to an etching solution such that the another material is removed while insubstantially diminishing the first oxide layer.

2. The method according to claim 1, wherein converting the second oxide layer is accomplished in an environment with a chemical element.

3. The method according to claim 2, wherein the chemical element is nitrogen.

4. The method according to claim 2, wherein the environment is ammonia.

5. The method according to claim 1, wherein converting the second oxide layer further comprises heating.

6. The method according to claim 2, wherein converting the second oxide layer further comprises heating.

7. The method according to claim 3, wherein converting the second oxide layer further comprises heating.

8. The method according to claim 4, wherein converting the second oxide layer further comprises heating.

9. The method according to claim 1, wherein converting the second oxide layer is performed at a temperature equal to or greater than 900 degrees Celsius.

10. The method according to claim 9, wherein converting the second oxide layer is performed at a pressure equal to or greater than 200 millitorr, and for a time equal to or greater than ten seconds.

11. A method of fabricating a semiconductor wafer, comprising:
   providing a semiconductor wafer having a first oxide layer and a second oxide layer formed thereon;
   converting the second oxide layer to oxynitride in an environment with ammonia and with heating; and
   simultaneously exposing the oxynitride and the first oxide layer to hot phosphoric acid such that the oxynitride is removed while insubstantially diminishing the first oxide layer.

12. The method according to claim 11, wherein converting the second oxide layer is performed at a temperature equal to or greater than 900 degrees Celsius.

13. The method according to claim 12, wherein converting the second oxide layer is performed at a pressure equal to or greater than 200 millitorr, and for a time equal to or greater than ten seconds.

14. A method of fabricating a semiconductor wafer, comprising:
   providing a semiconductor wafer having a first oxide layer and a second oxide layer formed thereon;
   converting the second oxide layer to oxynitride in an environment with ammonia and with heating;
   simultaneously exposing the oxynitride and the first oxide layer to hot phosphoric acid such that the oxynitride is removed while insubstantially diminishing the first oxide layer; and
   wherein converting the second oxide layer is performed at a temperature equal to or greater than 900 degrees Celsius, at a pressure equal to or greater than 200 millitorr, and for a time equal to or greater than ten seconds.

15. A method of fabricating a semiconductor wafer, comprising:
   providing a semiconductor wafer having a first oxide layer and a second oxide layer formed thereon;
   converting the second oxide layer to oxynitride in an environment with ammonia and with heating;
   simultaneously exposing the oxynitride and the first oxide layer to hot phosphoric acid such that the oxynitride is removed while insubstantially diminishing the first oxide layer;
   wherein converting the second oxide layer is performed at a temperature equal to or greater than 900 degrees Celsius, at a pressure equal to or greater than 200 millitorr, and for a time equal to or greater than ten seconds; and
   wherein removing the oxynitride is performed at a temperature greater than or equal to room temperature.

16. A method of fabricating a semiconductor wafer, comprising:
   providing a semiconductor wafer having a first oxide layer and a second oxide layer formed thereon;
   converting the second oxide layer to oxynitride in an environment with ammonia and with heating;
   simultaneously exposing the oxynitride and the first oxide layer to hot phosphoric acid such that the oxynitride is removed while insubstantially diminishing the first oxide layer; and
   wherein removing the oxynitride is performed at a temperature greater than or equal to room temperature.

* * * * *